(12) United States Patent
Sota

(10) Patent No.: US 6,731,014 B2
(45) Date of Patent: *May 4, 2004

(54) SEMICONDUCTOR PACKAGE SUBSTRATE, SEMICONDUCTOR PACKAGE

(75) Inventor: Yoshiki Sota, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/341,416

(22) Filed: Jan. 14, 2003

(65) Prior Publication Data

US 2003/0098502 A1 May 29, 2003

Related U.S. Application Data

(62) Division of application No. 10/139,351, filed on May 7, 2002, now Pat. No. 6,545,367.

(30) Foreign Application Priority Data

May 17, 2001 (JP) ......................................... 2001-148361

(51) Int. Cl.⁷ .......................... H01L 23/48; H01L 23/52; H01L 29/40
(52) U.S. Cl. .......................... 257/784; 257/786; 257/780
(58) Field of Search ................................ 257/784, 786, 257/780, 778, 781, 783, 698

(56) References Cited

U.S. PATENT DOCUMENTS 6,005,289 A    12/1999   Watanabe et al.
6,011,694 A    1/2000    Hirakawa
6,031,283 A    2/2000    Banerjee et al.
6,040,984 A    3/2000    Hirakawa
6,100,594 A    8/2000    Fukui et al.
6,184,580 B1   2/2001    Lin
6,414,381 B1   7/2002    Takeda
6,414,396 B1   7/2002    Shim et al.
6,448,639 B1   9/2002    Ma
6,545,367 B2 * 4/2003    Sota

FOREIGN PATENT DOCUMENTS

JP    9-121002    5/1997

\* cited by examiner

Primary Examiner—Sheila V. Clark
(74) Attorney, Agent, or Firm—Birch, Stewart, Kolasch & Birch, LLP

(57) ABSTRACT

A semiconductor package substrate of the present invention includes a first wiring substrate which has an opening section for mounting a semiconductor chip, and a second wiring substrate which has a second wire bonding terminal sections and second connecting terminal land sections, and through holes so that the second connecting terminal land sections on the first surface communicate to the second surface which is opposite to the first surface. The second surface of the first wiring substrate and the first surface of the second wiring substrate are mated in the state where the second wire bonding terminal sections are exposed. The semiconductor package substrate is suitable for a stacked semiconductor package, and capable of dense mounting. Also, it provides a stable and ensured mouting, thereby increasing the yield of the stacked semiconductor package.

14 Claims, 12 Drawing Sheets

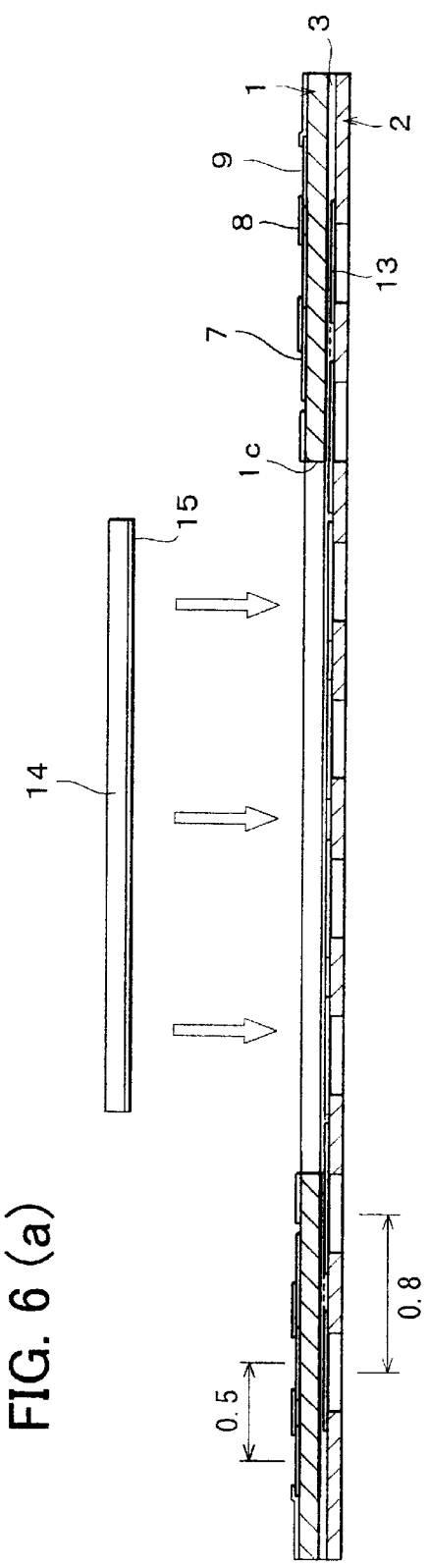
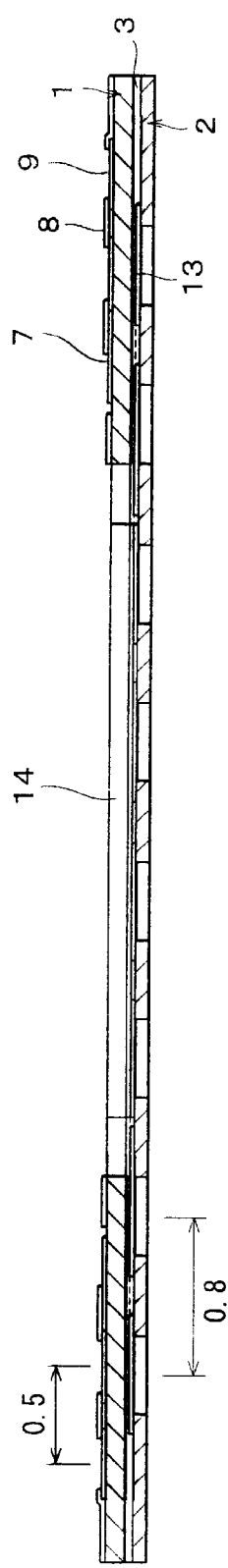
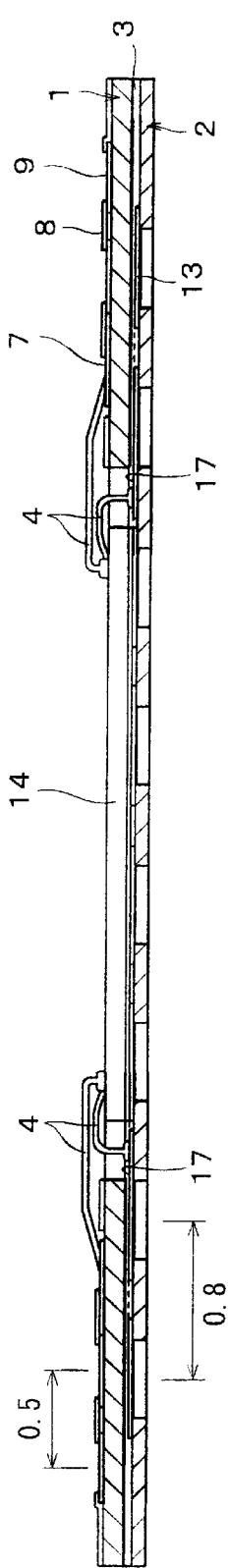
FIG. 6 (a)
FIG. 6 (b)
FIG. 6 (c)

SEMICONDUCTOR PACKAGE SUBSTRATE, SEMICONDUCTOR PACKAGE

This application is a divisional of application Ser. No. 10/139,351, filed on May 7, 2002 now U.S. Pat. No. 6,545,367, the entire contents of which are hereby incorporated by reference and for which priority is claimed under 35 U.S.C. §120; and this application claims priority of application Ser. No. 10/139,351 filed in Japan on May 7, 2002 under 35 U.S.C. §119.

FIELD OF THE INVENTION

The present invention relates to a semiconductor package and a substrate thereof, and in particular to a semiconductor package and a substrate suitable for dense mounting, and a stacked semiconductor package which includes other semiconductor packages for stacking, which are stacked on the semiconductor package.

BACKGROUND OF THE INVENTION

In resent years, a semiconductor device called CSP (Chip Size Package/Chip Scale Package) of BGA (Ball Grid Allay) type or QFP (Quad Flat Package) type, have been widely used for meeting a tendency to downsize electronic devices and automate its assembly process.

For high-speed signal processing and an improvement in the function of the semiconductor elements included in the foregoing semiconductor devices, a terminal for an electromagnetic shield and more terminals for input and output are required for the semiconductor package. Namely, more external terminals are now required in the foregoing semiconductor package.

For this reason, a package form called BGA type having external terminals disposed in a two-dimensional state on the bottom of the package has often been used because of its property which can provide more external terminals.

As an example of the BGA type semiconductor package, known is a semiconductor package in which a semiconductor chip is connected to the wiring substrate by a wire bonding with the circuit bearing side upward, and the electrodes of the semiconductor chip and the external terminals are conductive each other via a wiring pattern arranged on the wiring substrate.

The following will explain a semiconductor package as a resin sealing type semiconductor device using the foregoing conventional technique with reference to FIG. 9. Firstly, through holes 37 are formed in an insulating substrate 31 in accordance with the alignment pattern of external terminals of the BGA type. Then, terminal sections 33 for connecting to a semiconductor chip 44 (described later) are formed on the periphery of the insulating substrate 31.

Further, to prepare a wiring substrate 32, wiring patterns 43 are provided on the insulating substrate 31 by a Cu foil so that each end is exposed via the through holes 37. Next, the semiconductor chip 44 is mounted on the wiring substrate 32, and the semiconductor chip 44 and the terminal sections 33 are connected to each other by Au wires 34.

A sealing resin section 35 for sealing the semiconductor chip 44, the terminal sections 33, and the Au wires 34 is formed by a transfer mold method. Solder balls 36 are provided as connecting external terminals by a reflow connection so as to be connected to the wiring patterns 43 via the through holes 37.

Further, among these, a semiconductor package such as a memory mounted on a portable device is required to be downsized, and also required to increase the memory amount and the processing amount for adding a greater value. In order to meet these requirements, the semiconductor package having a plurality of semiconductor chips in a single package has been known.

As an example of this type of semiconductor package, a multi-chip module having a plurality of horizontally aligned semiconductor chips has been known; however, in this type of package, since the semiconductor chips are horizontally aligned, the semiconductor package will not be smaller than the gross area of the mounted semiconductor chips.

Meanwhile, known is a semiconductor package having a plurality of semiconductor chips stacked in a single package (hereinafter, referred to as a stacked package) so as to increase packaging density.

As an example of the stacked packages, Japanese Unexamined Patent Publication No. 204720/1999 (Tokukaihei 11-204720 published on Jul. 30, 1999, corresponding to the U.S. Pat. No. 6,100,594 granted on Aug. 8, 2000) discloses a semiconductor package having the CSP structure of substantially the chip size in which the semiconductor chip is mounted on an electrically insulative substrate, and the connecting external terminals are provided in a matrix manner on the rear surface of the electrically insulative substrate.

FIG. 10 schematically shows an arrangement of a stacked package having the foregoing structure. This stacked package is formed by die-bonding a first semiconductor chip 44a on the wiring substrate 32 with the circuit bearing side upward and die-bonding a second semiconductor chip 44b thereon. Thereafter, the first and second semiconductor chips 44a and 44b, and each terminal section 33 of the wiring substrate 32 are connected to each other using the Au wires 34 by a wire bonding method.

Further, a sealing resin section 35 is formed so as to seal the first and second semiconductor chips 44a and 44b, the terminal sections 33, and the Au wires 34, by the transfer mold method. Then, the solder balls 36 are formed as the external connecting terminals by the reflow connection so as to be connected to the wiring pattern 43 via the through holes 37.

This type of stacking can be performed when stacking semiconductor chips of three or so; however, when more semiconductor chips are stacked, stacking these semiconductor packages instead of stacking the semiconductor chips is more advantageous in terms of the yield. As an example of a semiconductor package for the stacking, a stacking semiconductor package 52 shown in FIG. 11 in which external terminals 54 are provided outside of the mounting area of the semiconductor chip 44 has been known.

The stacking semiconductor package 52 has an opening section 52a in the center of an insulating substrate 31, which is sized to be the mounting area of the semiconductor chip 44, and the package 52 includes the external terminals 54 in the peripheries of both surfaces of the insulating substrate 31. Also, the solder balls are provided on the external terminals 54 of one surface (normally, the rear surface) of the insulating substrate 31.

Then, as shown in FIG. 12, a plurality of the stacking semiconductor package 52 are stacked in the thickness direction, and the solder balls 36 are connected to the corresponding external terminals so as to be completed as the stacked semiconductor package.

In the stacked semiconductor package thus described, the connecting external terminals 54 are required to be respectively provided on the front surface and the rear surface so as to ensure electrical continuity between the vertically adjacent semiconductor packages 52, in other words, the semiconductor packages 52 adjacent in the thickness direction.

Therefore, in the stacking semiconductor package 52 having the structure of FIG. 11, the external terminals 54 are provided outside of the mounting area of the semiconductor chip 44 on the insulating substrate 31 to be joined to each other.

Incidentally, in the stacking semiconductor package 52 having the foregoing structure, it is necessary to increase packaging efficiency and density of semiconductor chips with respect to the mounting area of the semiconductor package. Therefore, the stacking semiconductor package 52 is required to be downsized.

Accordingly, the area of the external terminals 54 is required to be set as small as possible, which are provided outside of the mounting area of the semiconductor chip 44. Thus, a pitch between the external terminals 54 is required to be set as small as possible.

In the foregoing stacked semiconductor package having a plurality of the semiconductor packages 52 stacked thereon, the stacking of the semiconductor packages 52 is possibly performed by a package manufacturer; however, the mounting of the semiconductor package 52 on the bottom of the stack to a mounting substrate, in other words, to a motherboard, is often performed by a user.

However, in the foregoing conventional stacked semiconductor package, it has been difficult to stably mount the stacking semiconductor package 52 to the motherboard while keeping a large number of the external terminals 54, and the yield of the stacked semiconductor package adopting the stacking semiconductor packages 52 has been decreased due to such as a poor connection.

Namely, as described, there is a limitation for a stable mounting of the semiconductor package 52 to a motherboard by a user, when the semiconductor package 52 has a pitch, which is set as small as possible, between the external terminals 54. Accordingly, with the foregoing conventional stacked semiconductor package, it has been difficult to stably connect and mount the stacking semiconductor package 52, which has the external terminal 54 with the small pitch, to the motherboard while keeping a large number of the external terminals 54, and the yield of the stacked semiconductor package having the semiconductor packages 52 stacked in the thickness direction, has been decreased.

SUMMARY OF THE INVENTION

In order to solve the afore-stated problems, the semiconductor package substrate of the present invention includes:

a first wiring substrate 1, which has a first metal pattern for external connection of a semiconductor chip, and is provided on a first surface, including first wire bonding terminal sections, wiring sections, and first connecting terminal land sections, and an opening section for mounting a semiconductor chip;

a second wiring substrate, which has a second metal pattern including second wire bonding terminal sections and second connecting terminal land sections on a first surface, and through holes so that the second connecting terminal land sections on the first surface communicate to the second surface which is opposite to the first surface, the second surface of the first wiring substrate and the first surface of the second wiring substrate being combined so that the second wire bonding terminal sections are exposed.

With the foregoing arrangement, since the first wiring substrate has the opening section, the semiconductor chip can be mounted to the opening section, and electrical continuity with respect to the semiconductor chip is ensured via the first wire bonding terminal sections.

Further, in the foregoing arrangement, since the first wiring substrate has the wiring sections and the first connecting terminal land sections, electrical continuity between the first wire bonding terminal sections and the first connecting terminal land sections is ensured via the wiring sections, and it becomes possible to stack other semiconductor packages thereon, and electrical connection between the first wiring substrate and the stacked semiconductor packages can be ensured via the first connecting terminal land sections which are formed on the first surface of the first wiring substrate except for the mounting area of the semiconductor chip, i.e., the opening section.

Further, since the second wire bonding terminal sections of the second wiring substrate are exposed, it is possible to electrically connect the second wire bonding terminal sections to the semiconductor chip or the first wire bonding terminal sections. Further, the through holes are provided on the second wiring substrate so that the second connecting terminal land sections on the first surface of the second wiring substrate communicate to the second surface which is opposite to the first surface, thereby electrically connecting the second connecting terminal land sections to the second surface.

As described, in the foregoing arrangement, it is possible to dispose the second connecting terminal land sections on the second wiring substrate regardless of the mounting area of the semiconductor chip. Therefore, a large number of the second connecting terminal land sections, which are external terminals to, for example, the mounting substrate, communicating to the second surface, can be provided. Also, the pitch between the second connecting terminal land sections can be set to a greater interval.

Consequently, the yield will not decrease in the stacked semiconductor package having the foregoing arrangement.

In order to solve the afore-stated problems, the semiconductor package of the present invention includes:

a first wiring substrate, which has a first metal pattern for external connection of a semiconductor chip, and is provided on a first surface including first wire bonding terminal sections, wiring sections, first connecting terminal land sections, and an opening section for mounting a semiconductor chip;

a second wiring substrate, which has a second metal pattern including second wire bonding terminal sections and second connecting terminal land sections on a first surface, and through holes so that the second connecting terminal land sections on the first surface communicate to the second surface which is opposite to the first surface;

a semiconductor package substrate made up by mating the second surface of the first wiring substrate and the first surface of the second wiring substrate in the state where the second wire bonding terminal sections are exposed;

a semiconductor chip mounted on the metal pattern of the second wiring substrate via the opening with a circuit bearing side facing opposite to the second wiring substrate;

metal wires for causing electrical continuity among electrode pads of the semiconductor chip, the first wire bonding terminal sections, and the second wire bonding terminal sections;

a resin sealing section which covers and seals the semiconductor chip, the first wire bonding terminal sections, and the second wire bonding terminal sections; and external terminals formed on the second connecting terminal land sections.

In the foregoing arrangement, it is possible to dispose the second connecting terminal land sections on the second wiring substrate regardless of the mounting area of the semiconductor chip. Therefore, a large number of the second connecting terminal land sections which are external terminals to, for example, the mounting substrate, communicating to the second surface, can be provided, and the pitch between the second connecting terminal land sections can be set to a greater interval. Consequently, the yield will not decrease in the stacked semiconductor package having the foregoing arrangement.

Additional objects, features, and strengths of the present invention will be made clear by the description below. Further, the advantages of the present invention will be evident from the following explanation in reference to the drawings.

BRIEF DESCRIPTION OF THE DRAWINGS

FIGS. 6(a) through 6(c) are drawings schematically showing arrangements in another part of manufacturing steps of the semiconductor package.

DESCRIPTION OF THE EMBODIMENTS

Figure 1:
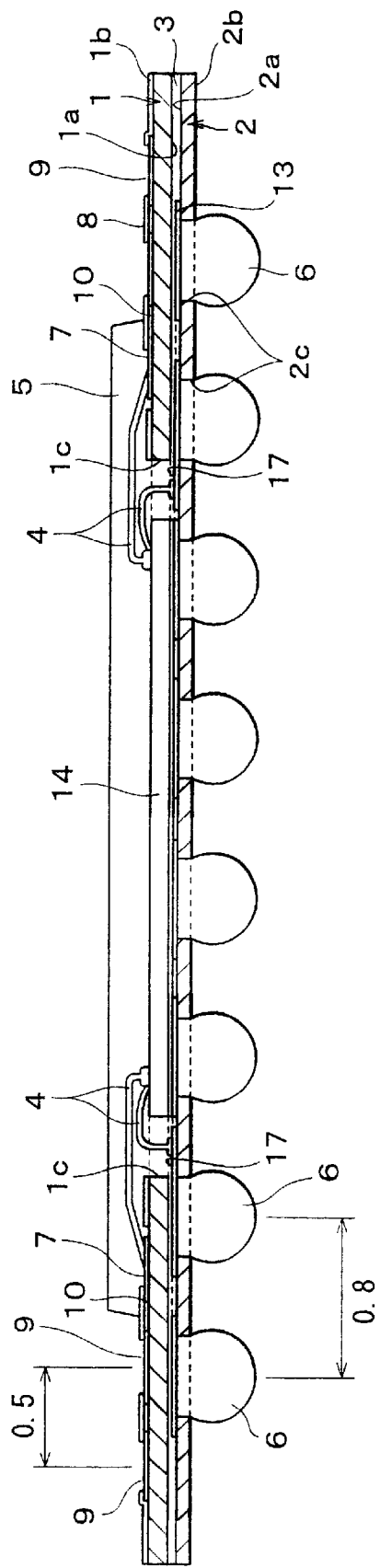
FIG. 1 is a drawing schematically showing an arrangement of a semiconductor package according to an embodiment of the present invention.
Figure 2:
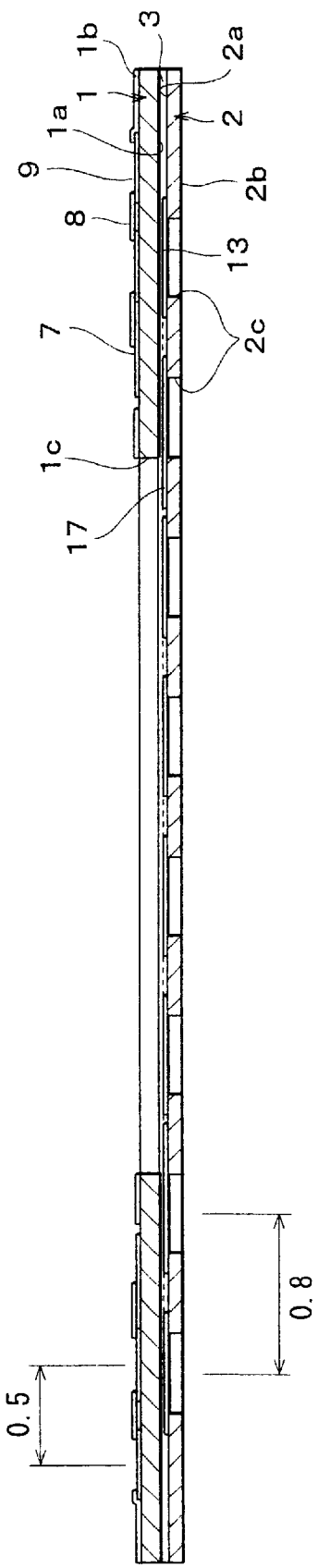
FIG. 2 is a drawing schematically showing an arrangement of a semiconductor package substrate used for the semiconductor package.

The following will explain regarding a semiconductor package substrate according to an embodiment of the present invention with reference to FIGS. 1 through 4. As shown in FIG. 2, the semiconductor package substrate includes a first wiring substrate 1, having the shape of substantially a rectangle plate, and a second wiring substrate 2, which has the same outer dimension as that of the first wiring substrate 1, i.e., having a shape of substantially a rectangle plate.

As shown in FIG. 1, the first wiring substrate 1 has a metal pattern (made of copper or aluminum, for example) on a first surface 1b which is opposite to a second surface 1a. The metal pattern includes first wire bonding terminal sections 7, wiring sections 10, and first connecting terminal land sections 9.

Figure 3:
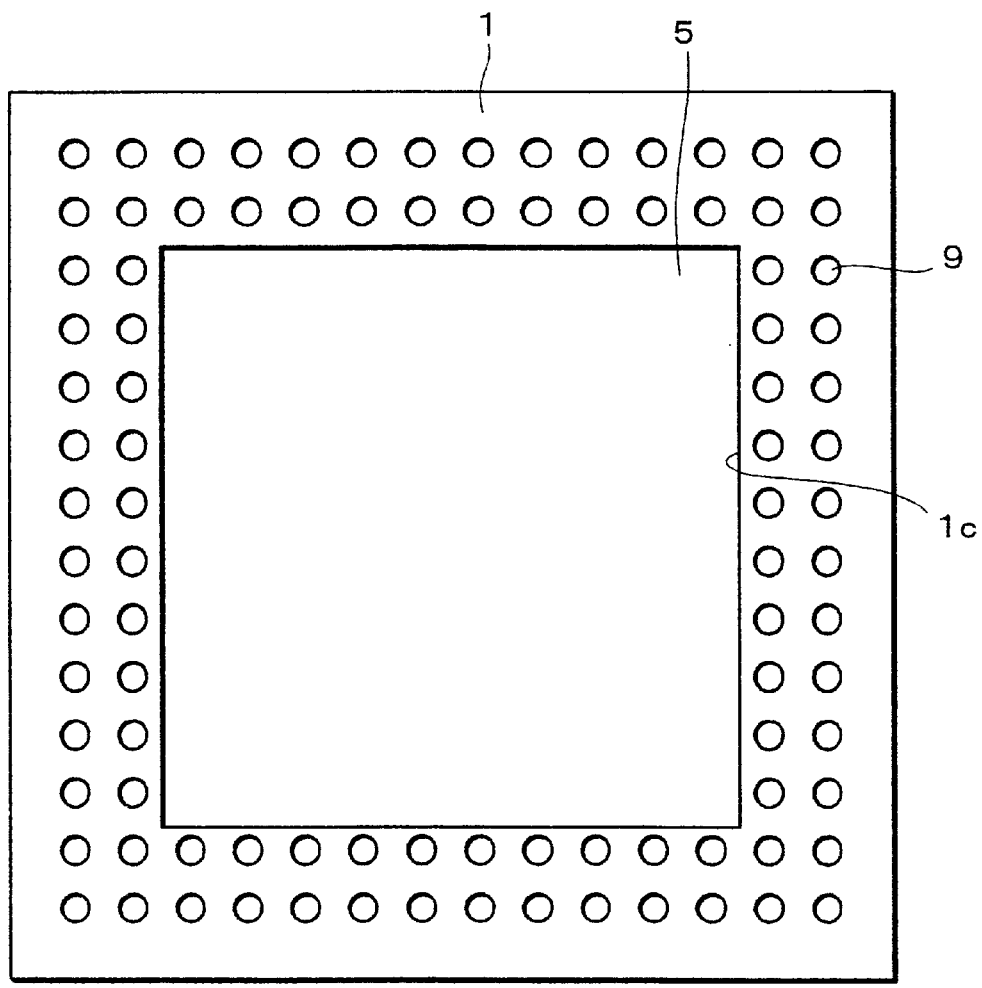
FIG. 3 is an upper view of the semiconductor package.

The first wire bonding terminal sections 7 are provided to be connected to electrodes of a semiconductor chip 14 by a wire bonding method. As shown in FIG. 3, the first connecting terminal land sections 9 are provided along the periphery of the first wiring substrate 1 to be electrically and mechanically connected to a stacking semiconductor package (described later).

Wiring sections 10 are wiring patterns for connecting the first wire bonding terminal sections 7 to the corresponding first connecting terminal land sections 9. Further, between each of the adjacent first connecting terminal land sections 9, solder resists 8 are respectively formed so as to ensure connection by solder balls (described later).

Further, an opening section 1c having the shape of substantially a rectangle, to which the semiconductor chip 14 is mounted, is provided in the center of the first wiring substrate 1. The opening section 1c penetrates through the first wiring substrate 1 in the thickness direction in a state of being concentric with the first wiring substrate 1. Thus, the first wiring substrate 1 is a loop having the shape of a square.

The second wiring substrate 2 has a metal pattern (made of copper or aluminum, for example) on a first surface 2a. The metal pattern includes second wire bonding terminal sections 17 and second connecting terminal land sections 13.

Further, a wiring pattern (not shown) is provided on the first surface 2a of the second wiring substrate 2 for connecting the second wire bonding terminal section 17 to the second the connecting terminal land section 13.

Figure 4:
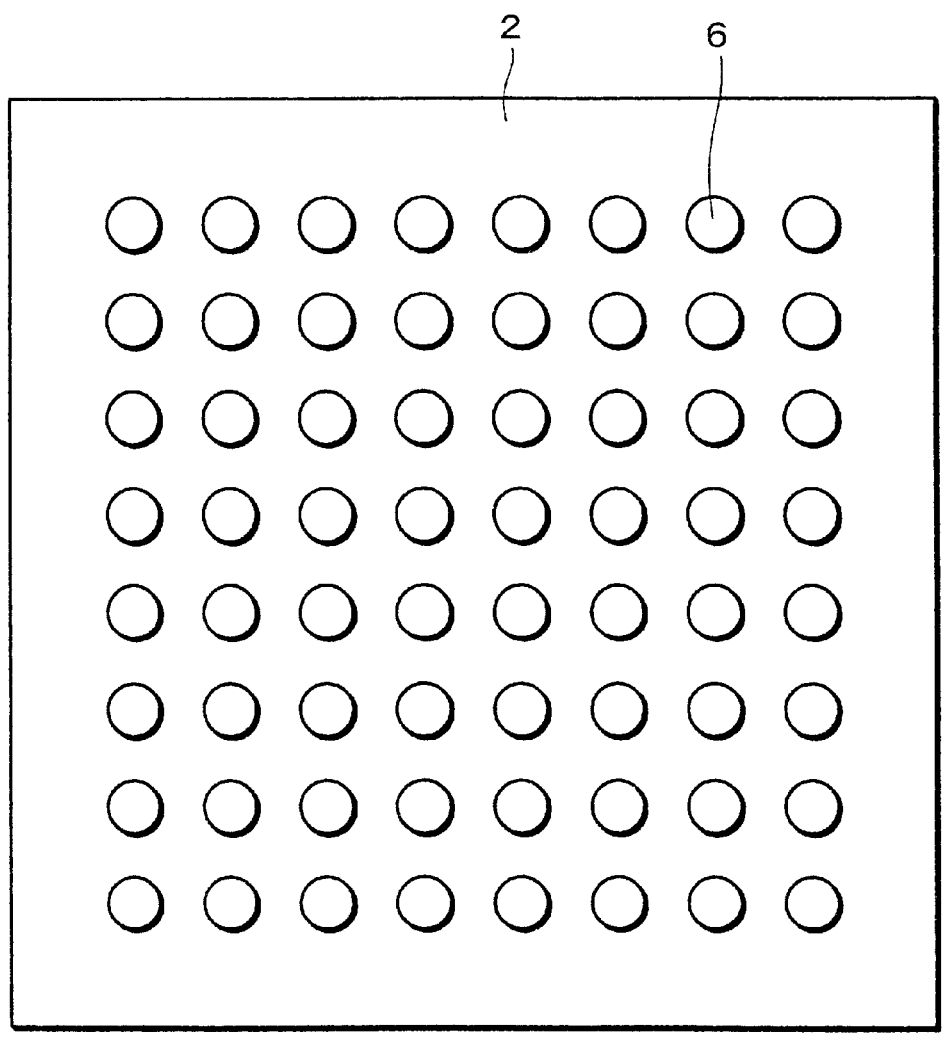
FIG. 4 is a bottom view of the semiconductor package.

Further, as shown in FIG. 4, through holes 2c are provided substantially evenly on the entire surface of the second surface 2b of the second wiring substrate 2 according to a disposing pattern of external terminals for connecting to a motherboard (described later). The through holes 2c are provided so that the second connecting terminal land sections 13 are exposed in the first surface 2a and to the second surface 2b which is opposite to the first surface 2a.

Further, in the foregoing semiconductor package substrate, the second surface 1a of the first wiring substrate 1 and the first surface 2a of the second wiring substrate 2 are bonded by matching their outer dimensions through an adhesive layer 3 so that the second wire bonding terminal sections 17 are externally exposed via the opening section 1c.

In the semiconductor package substrate thus described has a structure such that the semiconductor chip 14 is mounted in the opening section 1c of the second wiring substrate 2 so that the second wire bonding terminal sections 17 are externally exposed, and the solder balls 6 are provided as external terminals on the second connecting terminal land sections 13 via the through holes 2c.

Accordingly, in the semiconductor package substrate, a pitch between the adjacent solder balls 6 may be set to an interval (for example, an interval of 0.8 mm) greater than that (for example, an interval of 0.5 mm) between the adjacent first connecting terminal land sections 9, while securing a large number of the first connecting terminal land sections 9 which are connected to other stacking semiconductor package, and a large number of the solder balls 6 which are the external terminals for the motherboard.

As described, since it is possible to set a large pitch between the solder balls 6 while securing a large number of the solder balls 6, the semiconductor package substrate can be downsized and will be improved in terms of performance, and also the yield of mounting will increase when the semiconductor package substrate is mounted, for example, to the motherboard.

Figure 5:
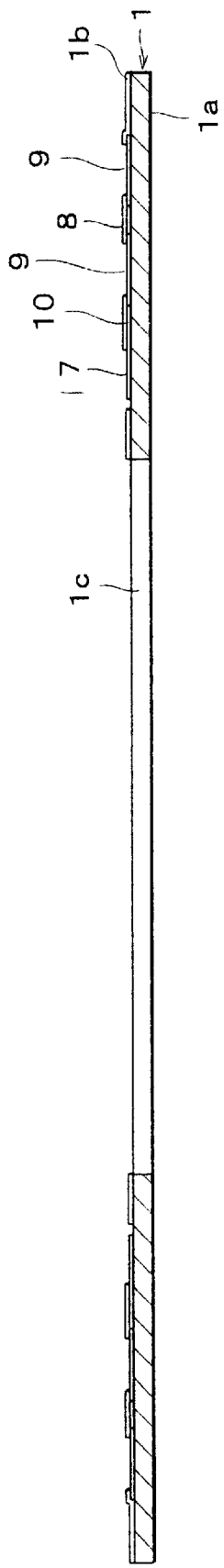
FIGS. 5(a) through 5(c) are drawings schematically showing arrangements in a part of manufacturing steps of the semiconductor package.
Figure 5:
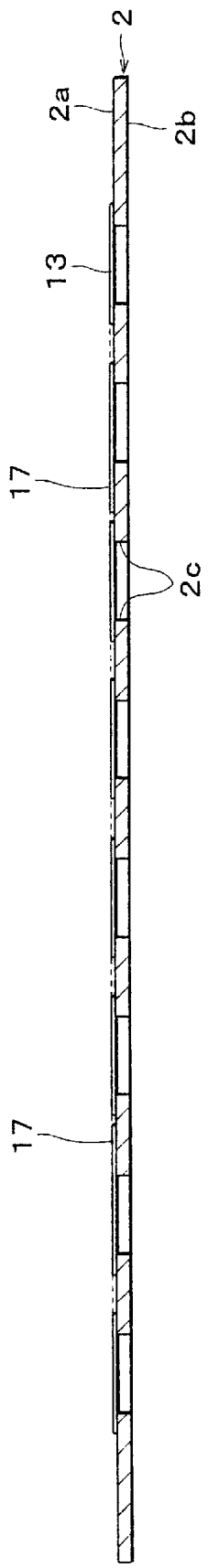
Figure 5:
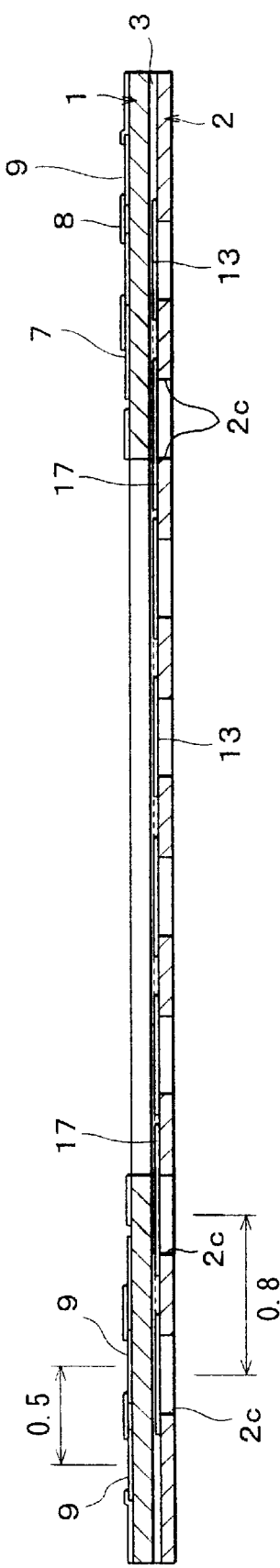
Figure 7:
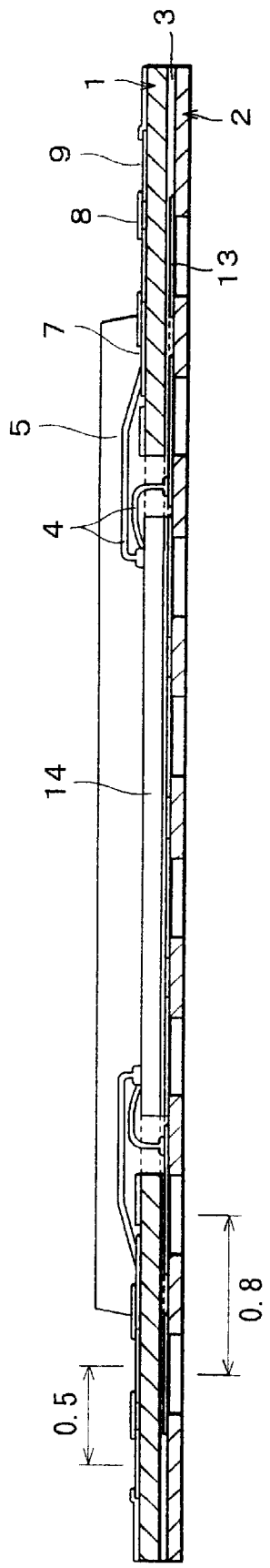
FIGS. 7(a) and 7(b) are drawings schematically showing arrangements in the rest of manufacturing steps of the semiconductor package.
Figure 7:
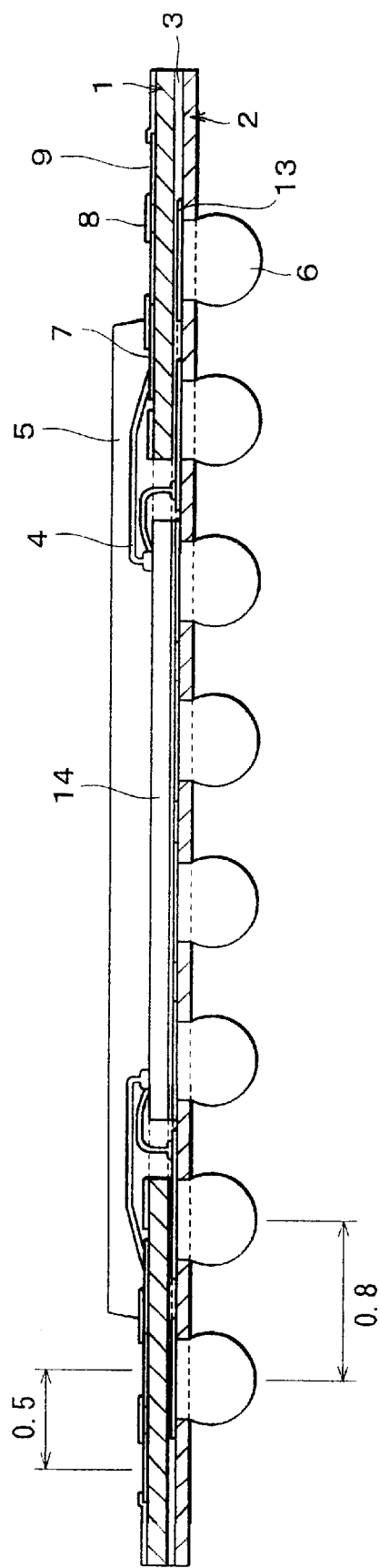

Next, the following will explain regarding the semiconductor package substrate, and a semiconductor package adopting the semiconductor package substrate, according to the present embodiment of the present invention with reference to FIGS. 5 through 7 which show the manufacturing steps thereof.

The first wiring substrate 1 is formed in the following manner. Firstly, as shown in FIG. 5(a), a copper foil of 18 µm thick is laminated on one surface of a glass epoxy-containing resin substrate of 60 µm thick. Then, a metal pattern is formed by an etching, and the whole surface is coated with a solder resist.

Next, the solder resist is removed, in other words, opened, so as to form the first wire bonding terminal sections 7 and the first connecting terminal land sections 9 therein.

Here, the solder resists 8 are formed between the respective first wire bonding terminal sections 7, and between the respective first connecting terminal land sections 9. Further, the solder resists 8 are formed between these first wire bonding terminal sections 7 and first connecting terminal land sections 9, and the wiring sections 10 are formed beneath the solder resists 8, which connect the first wire bonding terminal sections 7 to the first connecting terminal land sections 9.

Note that, the first wire bonding terminal sections 7 are provided in the vicinity of the mounting area of the semiconductor chip 14. Further, the first connecting terminal land sections 9 are formed with a 0.5 mm pitch, and having the diameter of 0.26 mm.

Thereafter, the opening section in the metal pattern of the copper foil was plated with nickel/gold. Finally, an opening section 1c, to which the semiconductor chip 14 is mounted, is formed by punching with a die so as to complete the first wiring substrate 1.

Next, to form the second wiring substrate 2, as shown in FIG. 5(b), a chrome (Cr) layer is formed on one surface of a polyimide-containing resin substrate of 25 µm thick by a sputtering, then is plated with a copper layer to be 18 µm thick.

Next, the etching is carried out only to the parts, corresponding to the through holes 2c of the polyimide-containing resin substrate so that the parts are removed (opened), then the second connecting terminal land sections 13 are formed. Also, a metal pattern is formed on the copper layer by the etching.

Here, the second connecting terminal land sections 13, which are adjacent each other, are provided with a 0.8 mm pitch and the diameter of 0.4 mm. Finally, the metal pattern of the copper layer is plated with nickel/gold.

Note that, the second wire bonding terminal sections 17 on the second wiring substrate 2 are provided inside of the opening section 1c of the first wiring substrate 1 but outside of the mounting area of the semiconductor chip 14.

Then, as shown in FIG. 5(c), the first wiring substrate 1 and the second wiring substrate 2 are bonded together by the adhesive layer 3 which contains an epoxy adhesive ao as to be prepared as the semiconductor package substrate.

Next, as shown in FIGS. 6(a) and 6(b), the semiconductor chip 14 is mounted on the second wiring substrate 2 in the opening section 1c which is the mounting area of the semiconductor chip 14 of the semiconductor package substrate. The semiconductor chip 14 is mounted so that the second wire bonding terminal sections 17 are exposed.

To mount the semiconductor chip 14, an insulating adhesive sheet as an adhesive 15 is adhered to a rear surface (the opposite surface of the circuit bearing side) of a semiconductor wafer which is a collection of semiconductor chips 14. Then, the semiconductor wafer is cut up into pieces by a dicing to be individual semiconductor chips 14, and a piece of the semiconductor chip 14 is mounted on the second wiring substrate 2.

Next, as shown in FIG. 6(c), electrode pad sections of the semiconductor chip 14 and the second wire bonding terminal sections 17 of the second wiring substrate 2 are connected by wires 4 of Au or the like, then, the same electrode pad sections of the semiconductor chip 14 and the first wire bonding terminal sections 7 of the first wiring substrate 1 are also joined by wires 4.

As the wires 4, gold wires having a diameter of 25 µm are adopted. The wires 4 should not be touched each other except the ones connected to the same electrode pad sections of the semiconductor chip 14.

Figure 8:
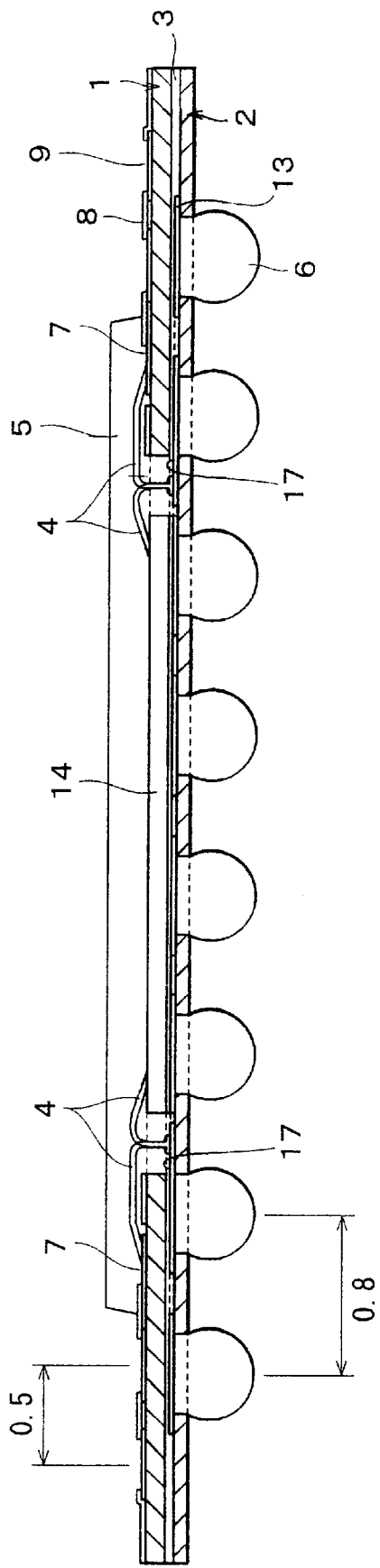
FIG. 8 is a drawing schematically showing an arrangement of a different form of the semiconductor package.
Figure 9:
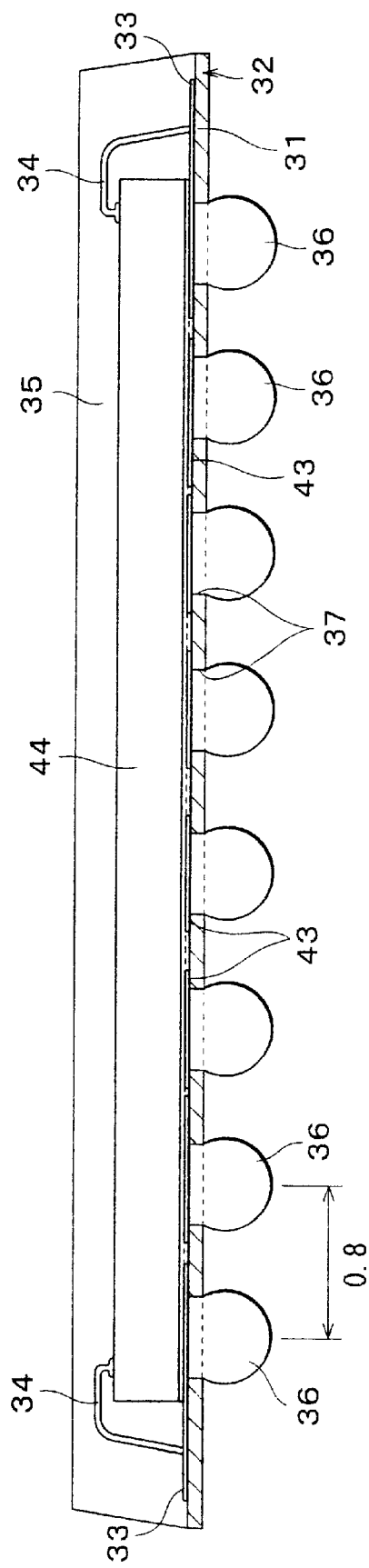
FIG. 9 is a drawing schematically showing an arrangement of a conventional semiconductor package.
Figure 10:
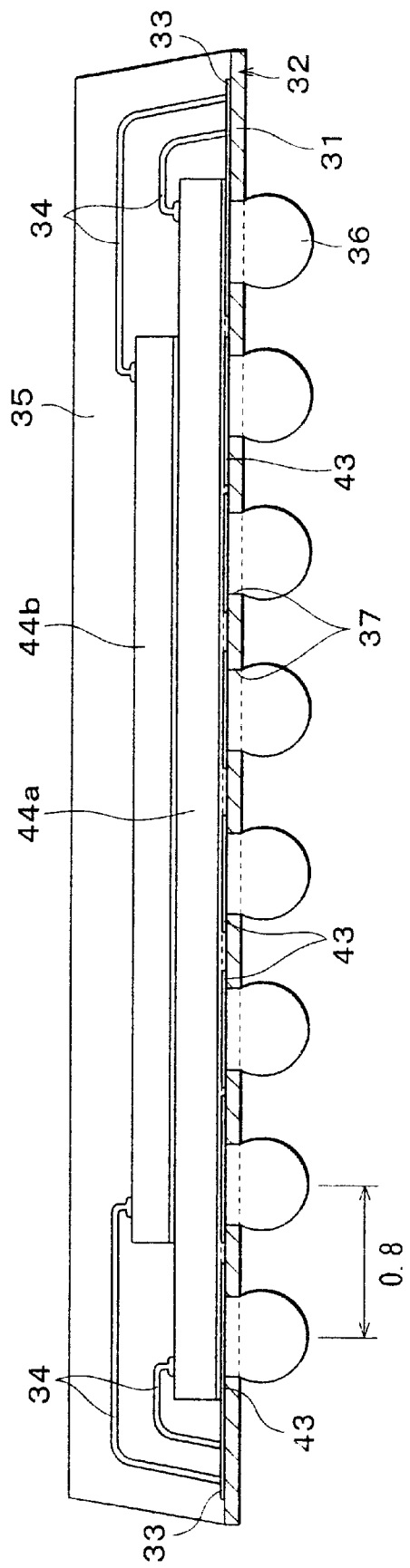
FIG. 10 is a drawing schematically showing an arrangement of another conventional semiconductor package.

Note that, as shown in FIG. 8, the first wire bonding terminal sections 7 of the first wiring substrate 1 and the second wire bonding terminal sections 17 of the second wiring substrate 2 may be connected, instead of connecting the electrode pad sections of the semiconductor chip 14 and the first wire bonding terminal sections 7 of the first wiring substrate 1, depending on how the electrode pad sections of the semiconductor chip 14, the first wire bonding terminal sections J of the first wiring substrate 1, and the second wire bonding terminal sections 17 of the second wiring substrate 2 are positioned.

Next, as shown in FIG. 7(a), a resin sealing section 5 is formed by covering the semiconductor chip 14, the wires 4, the first wire bonding terminal sections 7 of the first wiring substrate I and the second wire bonding terminal sections 17 of the second wiring substrate 2 for sealing these sections with a resin. The resin sealing section 5 is formed by a transfer mold method in which the injection of a sealing resin is carried out with the first wiring substrate 1 and the second wiring substrate 2 which are caught by a die.

After forming the resin sealing section 5, as shown in FIG. 7(b), the solder balls 6 of 0.45 mmφ are formed as external terminals by a reflow connection on the second connecting terminal land sections 13 having a diameter of 0.4 mm, of the second wiring substrate 2.

Note that, in the case where each substrate shown in FIGS. 5(a) and 5(b) is a combined substrate made up of plural substrates consecutively disposed in the surface direction, the combined substrate is divided to be an individual semiconductor package of one device, after the solder balls 6 of FIG. 7(b) are formed.

Figure 11:
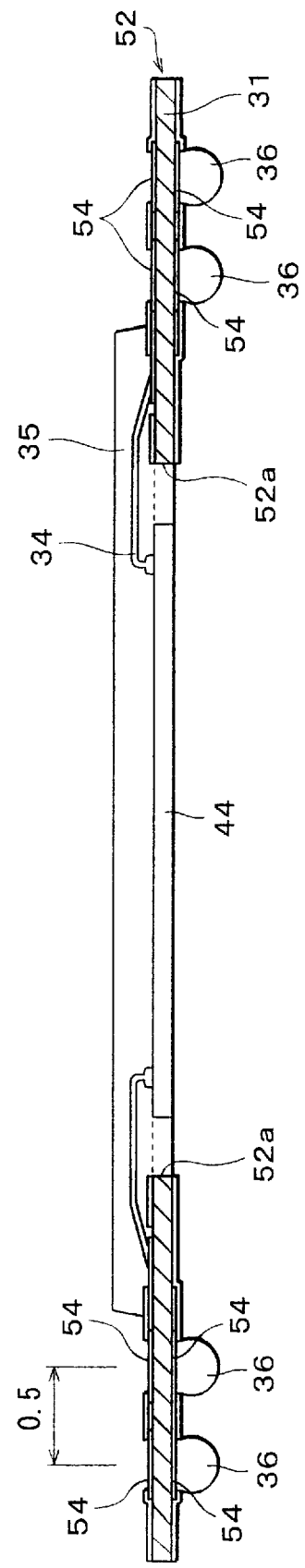
FIG. 11 is a drawing schematically showing an arrangement of a still another conventional stacking semiconductor package.
Figure 12:
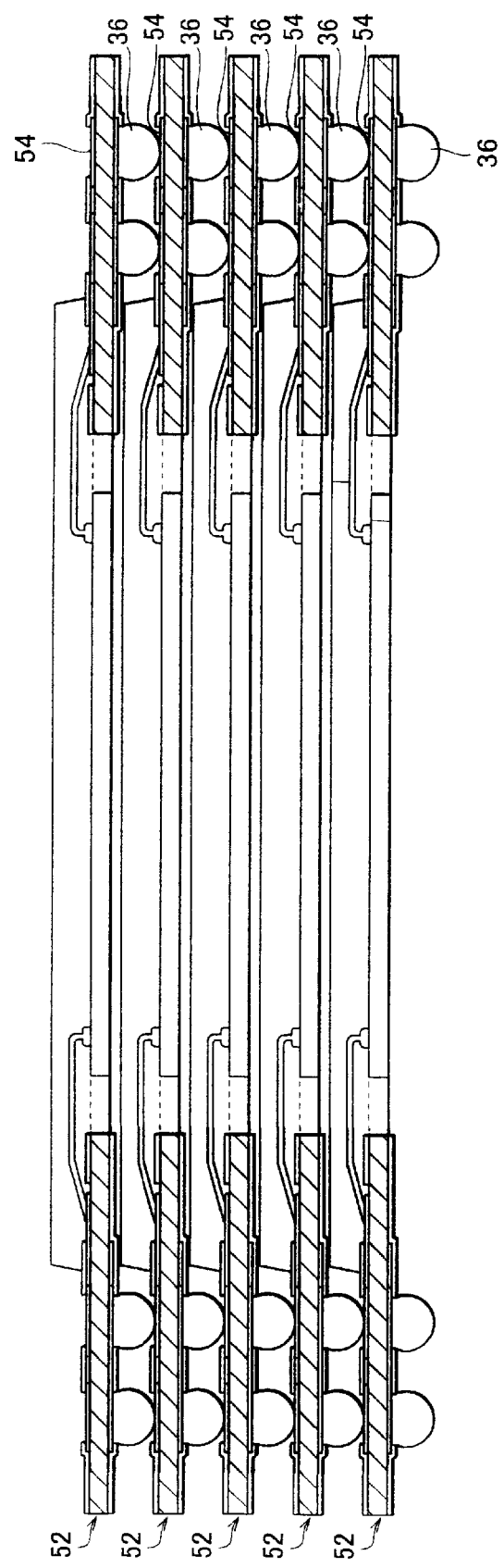
FIG. 12 is a drawing schematically showing an arrangement of stacked semiconductor package adopting the stacking semiconductor packages.

With the foregoing steps, the semiconductor package of the present invention is prepared. To create a stacked semiconductor package, the stacking semiconductor package 52 shown in FIG. 11, which was described in the background of the invention, is stacked on the foregoing semiconductor package of the present invention in the thickness direction by connecting the external terminals (external terminals for stacking) 54 to the first connecting terminal land sections 9.

Here, the external terminals 54 of the stacking semiconductor package 52 are disposed so as to be coincident with the first connecting land sections 9 of the semiconductor package of the present invention. Further, the external terminals 54 on the surface of the top stacking semiconductor package 52 can be used for external connection.

With the stacked semiconductor package thus described, it becomes possible to set the mounting area as small as possible with respect to the semiconductor chip 14 and to set the pitch between the solder balls 6 to a greater interval, the solder balls 6 being the external terminals of the lowest semiconductor package mounted to a motherboard by a user. This provides a stable and ensured mounting, thereby improving the yield of the stacked semiconductor package thus prepared.

In the conventional semiconductor package, the pitch between the external terminals was required to be small so as to set the mounting area of the stacked semiconductor package as small as possible for creating a stacked semiconductor package close to the chip size of the semiconductor chip. Therefore, there has been a difficulty in mounting of the semiconductor package to a motherboard (mounting substrate) by a user.

In contrast, by using the semiconductor package of the present invention as the lowest layer of the conventional stacked semiconductor package, it becomes possible to set the pitch to a large interval which can realize easy mounting of the package to a motherboard even by a user. Consequently, it provides a stable and ensured mounting.

In order to solve the afore-stated problems, the semiconductor package substrate of the present invention includes:

- a first wiring substrate, which has a first metal pattern for external connection of a semiconductor chip, and is provided on a first surface, including first wire bonding terminal sections, wiring sections, and first connecting terminal land sections, and an opening section for mounting a semiconductor chip; and
- a second wiring substrate, which has a second metal pattern including second wire bonding terminal sections and second connecting terminal land sections on a first surface, and through holes so that the second connecting terminal land sections on the first surface communicate to the second surface which is opposite to the first surface, the second surface of the first wiring substrate and the first surface of the second wiring substrate being combined so that the second wire bonding terminal sections are exposed.

In the semiconductor package substrate, it is preferable that the through holes are provided also on the portion facing the opening section.

With the foregoing arrangement, since the first wiring substrate has the opening section, the semiconductor chip can be mounted to the opening section, and electrical continuity with respect to the semiconductor chip is ensured via the first wire bonding terminal sections.

Further, in the foregoing arrangement, since the first wiring substrate has the wiring sections and the first connecting terminal land sections, electrical continuity between the first wire bonding terminal sections and the first connecting terminal land sections is ensured via the wiring sections, and it becomes possible to stack other semiconductor packages thereon, and electrical connection between the first wiring substrate and the stacked semiconductor packages can be ensured via the first connecting terminal land sections which are formed on the first surface of the first wiring substrate except for the mounting area of the semiconductor chip, i.e., the opening section.

Further, since the second wire bonding terminal sections of the second wiring substrate are exposed, it is possible to electrically connect the second wire bonding terminal sections to the semiconductor chip or the first wire bonding terminal sections. Further, the through holes are provided on the second wiring substrate so that the second connecting terminal land sections on the first surface of the second wiring substrate communicate to the second surface which is opposite to the first surface, thereby electrically connecting the second connecting terminal land sections to the second surface.

As described, in the foregoing arrangement, it is possible to dispose the second connecting terminal land sections on the second wiring substrate regardless of the mounting area of the semiconductor chip. Therefore, a large number of the second connecting terminal land sections, which are external terminals to, for example, the mounting substrate, communicating to the second surface, can be provided. Also, the pitch between the second connecting terminal land sections can be set to a greater interval.

Consequently, the yield will not decrease in the stacked semiconductor package having the foregoing arrangement.

In order to solve the afore-stated problems, the semiconductor package of the present invention includes:

- a first wiring substrate which has a first metal pattern for external connection of a semiconductor chip, including first wire bonding terminal sections, wiring sections, and first connecting terminal land sections, on a first surface, and an opening section for mounting a semiconductor chip;
- a second wiring substrate which has a second metal pattern including second wire bonding terminal sections and second connecting terminal land sections on a first surface, and through holes so that the second connecting terminal land sections on the first surface communicate to the second surface which is opposite to the first surface;
- a semiconductor package substrate made up by mating the second surface of the first wiring substrate and the first surface of the second wiring substrate in the state where the second wire bonding terminal sections are exposed;
- a semiconductor chip mounted on the metal pattern of the second wiring substrate via the opening with a circuit bearing side facing opposite to the second wiring substrate;
- metal wires for causing electrical continuity among electrode pads of the semiconductor chip, the first wire bonding terminal sections, and the second wire bonding terminal sections;
- a resin sealing section which covers and seals the semiconductor chip, the first wire bonding terminal sections, and the second wire bonding terminal sections; and
- external terminals formed on the second connecting terminal land sections.

In the foregoing arrangement, it is possible to dispose the second connecting terminal land sections on the second wiring substrate regardless of the mounting area of the semiconductor chip. Therefore, a large number of the second connecting terminal land sections which are external terminals to, for example, the mounting substrate, communicating to the second surface, can be provided, and the pitch between the second connecting terminal land sections can be set to a greater interval. Consequently, the yield will not decrease in the stacked semiconductor package having the foregoing arrangement.

In the foregoing semiconductor package, terminals of metal balls as external terminals may be joined to the second connecting terminal land sections.

In the foregoing semiconductor package, it is preferable that the pitch between terminals of the second connecting terminal land sections is set to a greater interval than that between the first connecting terminal land sections.

In the foregoing semiconductor package, at least one part of the wires may be electrically connected to the first and second wire bonding terminal land sections via the electrical pads of the semiconductor chip.

In the foregoing semiconductor package, at least one part of the wires may be electrically connected to the first wiring substrate and the electrode pads of the semiconductor chip via second wire bonding terminal sections.

In the foregoing semiconductor package, a stacking semiconductor package has external terminals for stacking at positions which correspond to the first connecting terminal land sections of the first wiring substrate, and is mounted to the first connecting terminal land sections via the external terminals for stacking.

In the foregoing semiconductor package, it is preferable that the first wiring substrate is made of a glass-epoxy, and the second wiring substrate is made of a polyimide or a polyimideamide. The first and second metal patterns are made of copper, gold, or the like. In the case of using copper for forming the metal patterns, the metal patterns may be plated with nickel, palladium, gold, or the like.

The first wiring substrate may be formed through the following manufacturing steps. As it is a single-sided wiring, a metal foil such as copper foil is bonded on one surface of an insulating material by an adhesive or the like. Then a resist is applied, and a pattern exposure is performed. Otherwise, a method which deposits a metal material on the surface of the insulating material by a sputtering instead of using an adhesive, a method which laminates a metal material on a whole surface and then patterns the metal material, a method which laminates a metal material after patterning with a resist, and a method laminates the insulating material on the metal foil, then patterns the metal material, may be adopted.

Note that, the opening section as the mounting area of the semiconductor chip may be formed in advance or formed after the metal pattern is formed. The opening section is formed by a die, or a router, or using an etching method or the like. As the manufacturing method of the second wiring substrate, the single sided wiring substrate may be used as with the first wiring substrate, which has the through holes previously formed to be connected to the external terminals.

Further, in the case of adopting a two-layer wiring substrate having metal patterns on both sides of an insulation substrate of an insulating material, electrical continuity of the wiring patterns on the both sides is ensured by processing the through holes with a laser or a drill, and filling the through holes with a conductive material. Note that, by setting the pitch between terminals of the connecting terminal land sections to a greater interval than that between the connecting terminal land sections of the first wiring substrate, mounting of the package becomes easier even by a user. Further, on the second wiring substrate, the second metal pattern may exist on the mounting area of the semiconductor chip.

The first wiring substrate and the second wiring substrate are combined by an adhesive so that the mounting area of the semiconductor chip of the second wiring substrate matches the opening section of the first wiring substrate. As for the adhesive used for combining these substrates, any materials can be provided that they resist the heat applied during the following assembly process.

A semiconductor chip is mounted on the semiconductor package substrate thus manufactured. Here, an insulating adhesive may be applied between the rear surface of the semiconductor chip and the substrate to join the chip and the substrate. This adhesive may be paste or a sheet.

After mounting the semiconductor chip, electrical continuity between the semiconductor chip and the first and second wiring substrates is ensured by a wire bonding. Here, the bonding wire is connected to ensure electrical continuity between the semiconductor chip, and the first and second wiring substrates, respectively.

Further, the semiconductor chip and the wire bonded part are protected by sealing with a resin. To perform the sealing, it may be performed by molding in a die, or, by a vacuum-printing method or a potting method. Finally, external terminals such as the solder balls are formed on the second connecting terminal land sections of the second wiring substrate to prepare the semiconductor package.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor package substrate, comprising:
   a first wiring substrate, which has a first metal pattern provided on a first surface for external connection of a semiconductor chip, and an opening section for mounting a semiconductor chip; and
   a second wiring substrate of a multilayer substrate, which has a second metal pattern including second wire bonding terminal sections and second connecting terminal land sections on a first surface, through holes so that the second connecting terminal land sections on the first surface communicate to a second surface which is opposite to the first surface, and a third metal pattern on a third plane provided as a separate layer from the first surface,
   the second surface of the first wiring substrate and the first surface of the second wiring substrate being combined so that the second wire bonding terminal sections are exposed.

2. The semiconductor package substrate as set forth in claim 1, wherein:
   the first wiring substrate is made of a glass-epoxy, and the second wiring substrate is made of a polyamide.

3. The semiconductor package substrate as set forth in claim 1, wherein:
   the through holes are formed also on the portion facing the opening section.

4. The semiconductor package substrate as set forth in claim 1, wherein:
   the first metal pattern includes at least one kind of first wire bonding terminal sections, wiring sections, and first connecting terminal land sections.

5. The semiconductor package substrate as set forth in claim 1, wherein:
   the through holes are filled with a conductive material.

6. The semiconductor package substrate as set forth in claim 1, wherein:
   the second wiring substrate is a two-layer substrate of which third plane is the second surface.

7. A semiconductor package comprising:
   a semiconductor package substrate, which comprises:
      a first wiring substrate, which has a first metal pattern for external connection of a semiconductor chip, and is provided on a first surface, including first wire bonding terminal sections, wiring sections, and first connecting terminal land sections, and an opening section for mounting a semiconductor chip;

a second wiring substrate, which has a second metal pattern including second wire bonding terminal sections and second connecting terminal land sections on the fist surface, through holes so that the second connecting terminal land sections on the first surface communicate to the second surface which is opposite to the first surface, and a third metal pattern on a third plane provided as a separate layer from the first surface;

a semiconductor package substrate made up by mating the second surface of the first wiring substrate and the first surface of the second wiring substrate so that the second wire bonding terminal sections are exposed;

a semiconductor chip mounted on the metal pattern of the second wiring substrate via the opening with a circuit bearing side facing opposite to the second wiring substrate;

metal wires for causing electrical continuity among electrode pads of the semiconductor chip, the first wire bonding terminal sections, and the second wire bonding terminal sections;

a resin sealing section which covers and seals the semiconductor chip, the first wire bonding terminal sections, and the second wire bonding terminal sections; and external terminals formed on the second connecting terminal land sections.

8. The semiconductor package as set forth in claim 7, wherein terminals of metal balls as external terminals are joined to the second connecting terminal land sections.

9. The semiconductor package as set forth in claim 7, wherein:

a pitch between terminals of the second connecting terminal land sections is set to a greater interval than that between the first connecting terminal land sections.

10. The semiconductor package as set forth in claim 7, wherein at least one part of the wires is electrically connected to the first and second wire bonding terminal land sections via the electrode pads of the semiconductor chip.

11. The semiconductor package as set forth in claim 7, wherein:

at least one part of the wires is electrically connected to the first wiring substrate and the electrode pads of the semiconductor chip via the second wire bonding terminal sections.

12. The semiconductor package as set forth in claim 7, wherein:

a stacking semiconductor package has external terminals for stacking at positions which correspond to the first connecting terminal land sections of the first wiring substrate, and is mounted to the first connecting terminal land sections via the external terminals for stacking.

13. The semiconductor package substrate as set forth in claim 7, wherein:

the second wiring substrate is a two-layer substrate of which third side is the second surface.

14. The semiconductor package substrate as set forth in claim wherein:

the through holes are filled with a conductive material.

* * * * *